United States Patent [19]
Wright et al.

[11] Patent Number: 6,055,611
[45] Date of Patent: Apr. 25, 2000

[54] METHOD AND APPARATUS FOR ENABLING REDUNDANT MEMORY

[75] Inventors: Jeffrey P. Wright; Paul M. Fuller, both of Boise, Id.

[73] Assignee: Micron Technology, Inc., Boise, Id.

[21] Appl. No.: 08/890,257

[22] Filed: Jul. 9, 1997

[51] Int. Cl.$^7$ ................................ G11C 7/00; G11C 8/00
[52] U.S. Cl. .......................... 711/162; 711/105; 365/200; 714/6
[58] Field of Search .................................. 711/162, 105; 365/200, 230.06; 714/710, 711, 6, 7, 8

[56] References Cited

U.S. PATENT DOCUMENTS

| | | | |
|---|---|---|---|
| 4,514,830 | 4/1985 | Hagiwara et al. | 365/200 |
| 4,538,245 | 8/1985 | Smarandoiu et al. | 365/200 |
| 4,639,897 | 1/1987 | Wacyk | 365/200 |
| 4,935,899 | 6/1990 | Morigami | 365/200 |
| 5,148,391 | 9/1992 | Zagar | 365/96 |
| 5,200,652 | 4/1993 | Lee | 307/465 |
| 5,208,177 | 5/1993 | Lee | 437/47 |
| 5,233,206 | 8/1993 | Lee et al. | 257/50 |
| 5,238,862 | 8/1993 | Blalock et al. | 437/52 |
| 5,241,496 | 8/1993 | Lowrey et al. | 365/96 |
| 5,250,459 | 10/1993 | Lee | 437/52 |
| 5,282,158 | 1/1994 | Lee | 365/96 |
| 5,301,153 | 4/1994 | Johnson | 365/200 |
| 5,313,424 | 5/1994 | Adams et al. | 365/200 |
| 5,315,177 | 5/1994 | Zagar et al. | 307/465 |
| 5,325,334 | 6/1994 | Roh et al. | 365/201 |
| 5,331,196 | 7/1994 | Lee et al. | 257/529 |
| 5,383,156 | 1/1995 | Komatsu | 365/200 |
| 5,412,593 | 5/1995 | Magel et al. | 365/96 |
| 5,446,695 | 8/1995 | Douse et al. | 365/222 |
| 5,461,586 | 10/1995 | Nasu | 365/200 |
| 5,517,455 | 5/1996 | McClure et al. | 365/225 |
| 5,532,966 | 7/1996 | Poteet et al. | 365/200 |
| 5,646,896 | 7/1997 | Pinkham | 365/200 |
| 5,699,306 | 12/1997 | Lee et al. | 365/200 |
| 5,798,973 | 8/1998 | Isa | 365/200 |
| 5,812,468 | 9/1998 | Shirley | 365/200 |
| 5,838,620 | 11/1998 | Zagar et al. | 365/200 |

FOREIGN PATENT DOCUMENTS

209751   8/1990   Japan .

*Primary Examiner*—Eddie P. Chan
*Assistant Examiner*—Hong Kim
*Attorney, Agent, or Firm*—Schwegman, Lundberg, Woessner & Kluth, P.A.

[57] ABSTRACT

A method and apparatus for selectively enabling and disabling access to prime and redundant memory elements based on an address to a prime memory element is described. By receiving a prime element address and comparing it to program defective addresses, a signal indicating a correspondence between addresses is provided when a match occurs. The indication may be used as a select signal to a multiplexer for selecting between inputs. Moreover, an indication of a correspondence between addresses may be latched for temporary storage. The signal indicating whether or not a match has been found is provided to an override circuit, which selectively determines which enable signals are to be active and which are to be inactive. This allows for access to a prime element, a redundant element instead of a prime element, a redundant element instead of a prime and/or a redundant element, and so on. Additionally, a timing control enable signal may be employed to control timing of providing an enable signal. The memory having enable circuitry may be employed in any of a variety of memories and systems.

14 Claims, 8 Drawing Sheets

METHOD AND APPARATUS FOR ENABLING REDUNDANT MEMORY

TECHNICAL FIELD OF THE INVENTION

The invention relates generally to enabling memory cells, and more particularly, relates to effectively replacing a defective portion of a memory array with a spare portion of the memory array.

BACKGROUND OF THE INVENTION

In manufacturing memory devices, several stages are employed. At an early stage in the process, called probe, it is typical to test a memory array for defects. If an address is identified as defective, the row or column associated with the defective address is typically disabled in favor of a redundant row or column, as applicable. This is accomplished by programming the address associated with the defective row or column into the memory, such as to assign the address associated with the defective row or column to the redundant row or column. Such programming may be accomplished by programming a bank of fuse and/or anti-fuse elements or programmable elements such as nonvolatile memory. In this manner, once a defective address is received to a memory, the defective address is remapped to a redundant element address associated with the fuse and/or antifuse bank. This process of remapping defective memory array elements to redundant memory array elements is well known in the manufacture of memory devices, especially dynamic random access memory (DRAM) devices.

Later in the manufacturing process, a memory array is typically tested again. Often such a test reveals defects previously not discovered at probe. Again, if a defect is found in the memory array requiring remapping to a redundant element, a bank of programmable elements is programmed with the defective address. However, if the defect discovered at the latter test step is in actuality a defect in a redundant element (i.e., a redundant memory element in an array designated to replace or repair a defective prime memory element in the array), then an error would exist with respect to two separate redundant banks enabling separate redundant elements for a single address.

To avoid this error, test circuitry has been introduced within some memory integrated circuits. Such test circuitry provides information as to whether a redundant element is already enabled. By testing a particular address, the test circuitry indicates whether the address is associated with a redundant element. As the address to the defective memory element is programmed into a bank, the test circuitry makes it possible to identify which bank is programmed with the address. To identify which bank is programmed with the defective address, all banks are typically logically OR'd together. A test may be employed to ensure that no two banks are activated for the same defective address. For example, if a defect is found in a memory array and a redundant element is to be enabled therefor, a test is employed to determine if such address has already been programmed to a bank. If so, it means that the redundant element associated with the bank is defective too. Consequently, the bank is disabled in favor of a new bank associated with a new redundant element. Such a repair to a repair may be effected in part by programming an antifuse to disable the previously enabled bank.

However, to avoid the above-mentioned error of enabling two redundant elements for the same address, these circuits have required a significant amount of test mode circuitry in the memory device, and have further required significant lengthening of test mode time for the device. Consequently, it would be desirable to avoid introduction of such test mode circuitry and to reduce test mode time, and still be able to avoid the error of having two or more redundant elements enabled for a single defective address.

SUMMARY OF THE INVENTION

The present invention provides method and apparatus for employing a redundant memory element. An address path receives a first and a second address. The first and second addresses are compared to provide an output. A device is configured to receive the output to disable access to a portion of the memory array when the first address matches or corresponds to the second address.

It should be understood that there are two types of memory elements within an array based on designation, namely prime memory elements and redundant memory elements. Redundant memory elements are conventionally those in excess of the number of prime memory elements (bits) needed to meet an industry standard size (e.g., 4 megabit, 16 megabit, 64 megabit, 256 megabit, and so on). Therefore, if all prime memory elements are functional, no redundant memory elements need be employed.

While prime and redundant memory elements have different row and column designations (addresses) within a memory array, a bank (group) of programmable elements may be programmed with a prime element address for accessing a redundant element. The bank is tied to a redundant element for such access. The bank may be a fuse bank, antifuse bank, or nonvolatile memory such as a read-only memory, flash memory, and the like.

In this manner, if a prime element address has been found defective, it is associated with a redundant element. By comparing a first prime element address to access the memory array with a second address programmed to a bank, if a relationship is found, both addresses are to the same prime element. The relationship between addresses facilitates disabling access to prime memory elements located at the first address in favor of enabling access to redundant elements associated with the bank.

The present invention facilitates enabling access to one element and disabling access to another element by a select device or circuit coupled for receiving an indication of when equivalence between addresses occurs. Moreover, the present invention is not limited to comparing only two addresses at a time, rather, more than two addresses may be compared to determine which element should be accessed and which element(s) should not be accessed.

In handling more than two addresses, additional address paths are employed in accordance with the present invention. Furthermore, received addresses may be grouped into blocks. One block may have priority over another. Each block may be made up of one or more address buses.

Memory in accordance with the present invention may be employed in a system. In which case, an interface may be used to exchange information between the system and the memory. The interface may be one or a plurality of buses.

A memory device in accordance with the present invention may further include temporary storage, input select capability, and output timing capability for control. Such control may be used for synchronizing operation of a memory device in accordance with the present invention to an internal or external clock. Moreover, such control may be asynchronous. Furthermore, control may be employed to allow other circuits to perform a task within a given time frame prior to proceeding to a next task.

The present invention also provides processes for accessing a memory. A plurality of addresses may be received and compared for a match. An indication of a match may be provided for deactivating access to one portion of memory in favor of activating access to another portion of a memory.

Other features and embodiments of the present invention are described or are apparent from reading the detailed description or by practicing the present invention.

BRIEF DESCRIPTION OF THE DRAWINGS

The features of the present invention, as well as objects and advantages, will best be understood by reference to the appended claims, detailed description of particular embodiments and accompanying drawings where:

Reference numbers refer to the same or equivalent parts of the present invention throughout the several figures of the drawings.

DETAILED DESCRIPTION OF THE PREFERRED EMBODIMENTS

Figure 1:
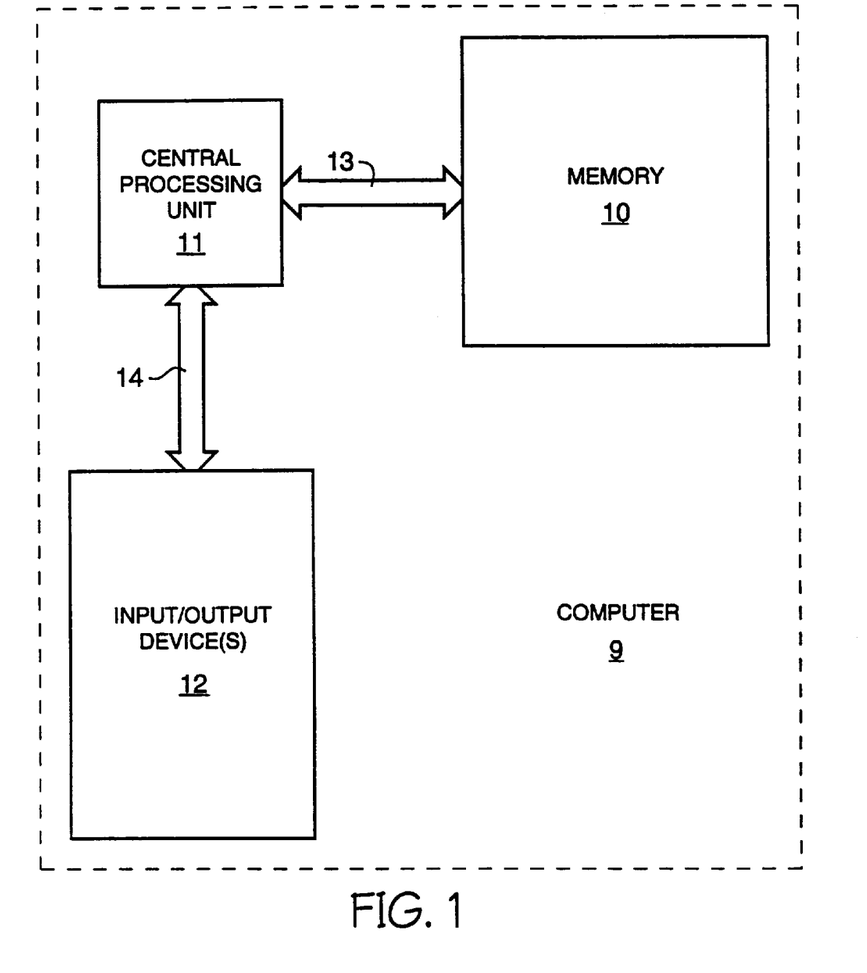
FIG. 1 is a block diagram of a computer having a memory in accordance with the present invention.

Referring to FIG. 1, there is shown a block diagram of computer 9 having input/output device(s) 12, central processing unit 11, and memory 10 in accordance with the present invention. Central processing unit 11 is coupled to memory 10 and input/output device(s) 12 by paths 13 and 14. Such paths 13, 14 allow exchange of information between computer 9 components. In particular, path 13 includes data input/output 25, address input (pathway) 26, and control input 27, all shown in FIG. 2.

Figure 2:
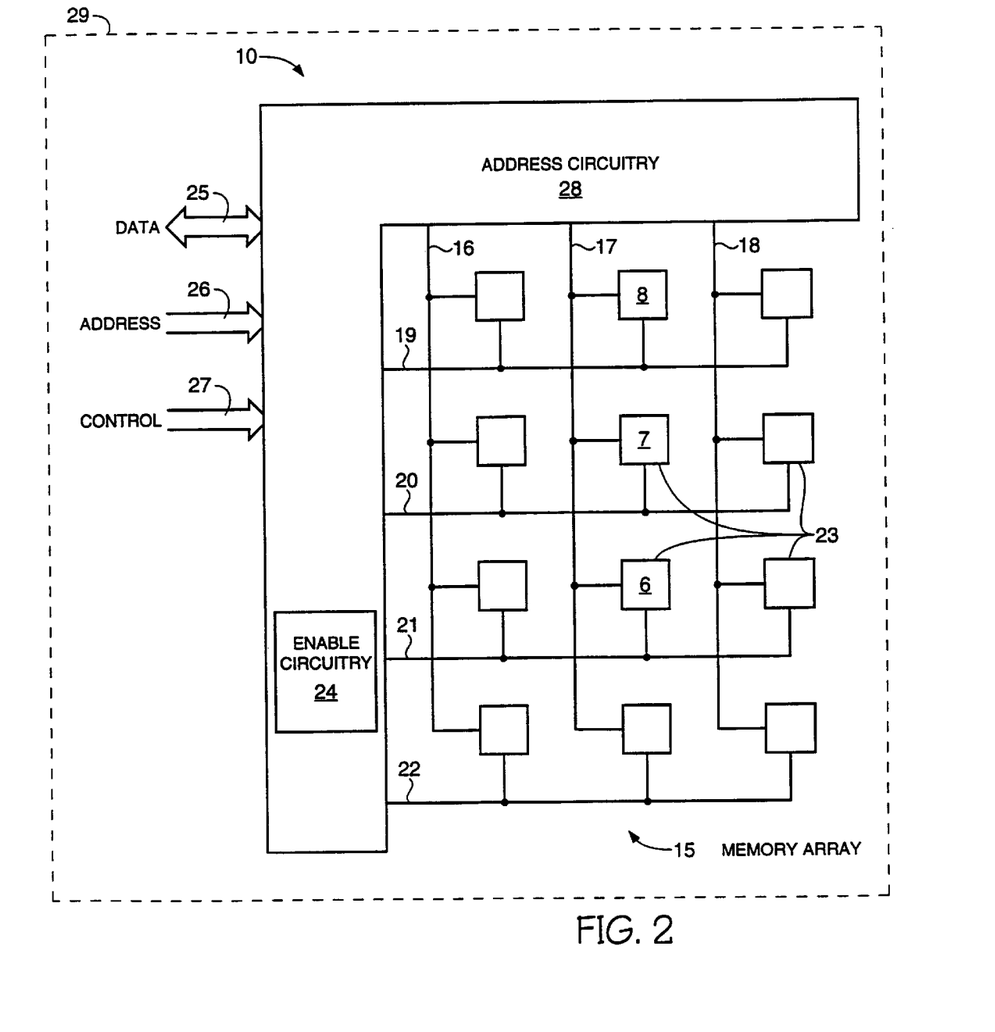
FIG. 2 is a block diagram of a memory in accordance with the present invention.

Now referring to FIG. 2, there is shown memory 10 in accordance with the present invention. Memory 10 may be employed in a variety of systems 29, such systems may include but are not limited to memory modules, network cards, telephones, scanners, facsimile machines, routers, copy machines, displays, printers, calculators, and computers, among others.

Memory 10 includes access circuitry 28. Access circuitry 28 receives data via data input 25, addresses via address pathway 26, and control signals via control input 27. Access circuitry 28 includes enable circuitry 24 in accordance with the present invention. Coupled to access circuitry 28 is memory array 15. Memory array 15 includes a plurality of memory cells 23, which are coupled to access circuitry 28 by rows 19–22 and columns 16–18. Selected cells 23 may form or be part of prime memory array elements, while other cells 23 are redundant memory elements. Again, by "redundant memory element" it is meant that there are elements which, if all prime memory elements were functional, would not become active elements within array 15 (i.e., they are initially electrically outside of array 15). It should be understood that an "element," including prime and redundant memory elements, as used herein includes a memory cell, a memory row, a memory column, a block of memory, a partial array or subarray of memory, and the like. In most currently-envisioned applications, an "element" will be a column or a row of memory cells.

As is known, in order to increase memory integrated circuit (memory chip) yield, redundant memory elements are included in memory array 15. Therefore, when a prime memory element is found defective, it may be replaced by a redundant memory element. By way of illustration and not limitation, if cell 8 of memory array 15 is found defective, it may be replaced by memory cell 7 by disabling row (prime element) 19, which includes defective cell 8, and by replacing it in array 15 with of row (redundant element) 20. Again, by way of illustration and not limitation, if cell 7 was subsequently also found to be defective, it may be replaced by memory cell 6 by disabling row (prime element) 20, which includes defective cell 7, and by replacing it in array 15 with of row (redundant element) 21. Notably, replacing row 20 with row 21 in the above example is a "repair of a repair." In this manner, redundant memory elements may be used in place of prime memory elements. While the above example has been described with respect to redundant row memory elements, it should be equally understood that the same holds true for redundant column memory elements.

Figure 3:
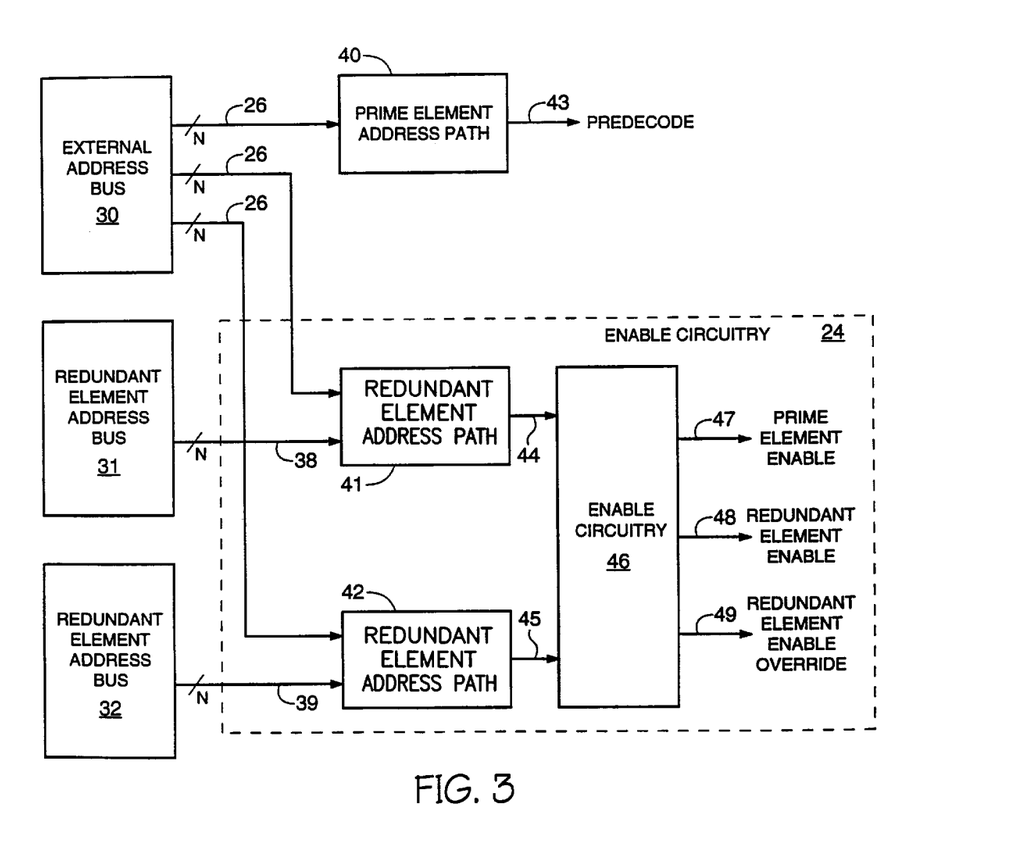
FIG. 3 is a block diagram of enable circuitry in accordance with the present invention.

Referring to FIG. 3, there is shown a block diagram of enable circuitry 24 in accordance with the present invention. Also shown are external address bus 30, redundant element address bus 31, redundant element address bus 32, and prime element address path 40, all of which are well known in the art of the present invention. While redundant element address bus 31 and redundant element address bus 32 are well known, their implementation as described herein is unique to the present invention, as will be explained with continuing reference to FIG. 3 and renewed reference to FIG. 2. External address bus 30 receives address information via address pathway 26. The width of address pathway 26 depends upon which addressing scheme is employed. By way of example and not limitation, if address information is provided serially or an address has a bit length of 1, then N (the number of address paths) will be equal to 1. However, if address information is provided in parallel and has a bit length of more than 1, then N may equal the address bit length. Moreover, such bits may be multiplexed onto fewer lines than the number of bits in the address bit length.

Address information (one or more addresses) is provided from address bus 30 via address pathway 26 to enable circuitry 24 and to prime element address path 40. Prime element address path 40 provides PREDECODE signal 43 for accessing memory array 15. Bus 30 may be an external or internal bus with respect to memory 10. However, for purposes of illustration, bus 30 will be described herein as an external bus.

Address pathway 26 provides address information to redundant element address path 41 and redundant element address path 42. In this manner, an address for accessing a memory element in memory array 15 may be provided to paths 41, 42.

Prior to the present invention, redundant element address bus 31 would be disabled by disabling an associated programmable bank or element in favor of enabling a programmable bank or element associated with redundant element bus 32 to effect a repair of a defective element, as discussed elsewhere herein. However, in accordance with the present invention, redundant element address bus 31 does not have to be disabled, as is explained elsewhere herein. Notably, redundant element address buses 31, 32 have one or more lines in electrical communication with a plurality of banks for storing programmed prime element addresses. Known circuitry may be used for reading such banks to provide address information onto one or more lines of buses 31, 32. As such information may be multiplexed onto one or more lines of buses 31, 32, it is not necessary that N be equal in number to address bit length. As mentioned elsewhere herein, each bank of banks is in electrical communication with a redundant element. Each redundant element may then be accessed after its associated bank is programmed.

In operation, prime element address paths 41, 42 receive input from external address bus 30 and redundant element address buses 31, 32, respectively. As described in more detail elsewhere herein, paths 40, 41, 42 have logic gates to provide the below mentioned functionality.

External address bus 30 provides prime element address information to prime element address path 40 and to redundant element address paths 41, 42. Redundant element address bus 31 provides programmed prime element address information to redundant element address path 41 via pathway 38. Redundant element address bus 32 provides programmed prime element address information to redundant element address path 42 via pathway 39.

Redundant element address paths 41, 42 receive prime element address information and programmed prime element address information for comparison with each other. If redundant element address path 41 identifies a match between two received addresses, then an indication is sent via match signal 44 to enable circuitry 46. Circuitry 46 disables prime element enable (signal) 47 in favor of redundant element enable (signal) 48. If both redundant element address path 41 and 42 indicate a match of addresses, both match signal 44 and 45 are sent to enable circuitry 46. In which case, signals 47, 48 are disabled (made inactive or deactivated) in favor of redundant element enable override (signal) 49.

In this manner, one redundant element is automatically made inactive in favor of enabling a subsequent redundant element. Moreover, matches take place automatically by comparing a prime element address to programmed defective element addresses. Thus, by processing address information in such a manner, no test circuitry and no match test, as explained elsewhere herein, are needed.

Figure 4:
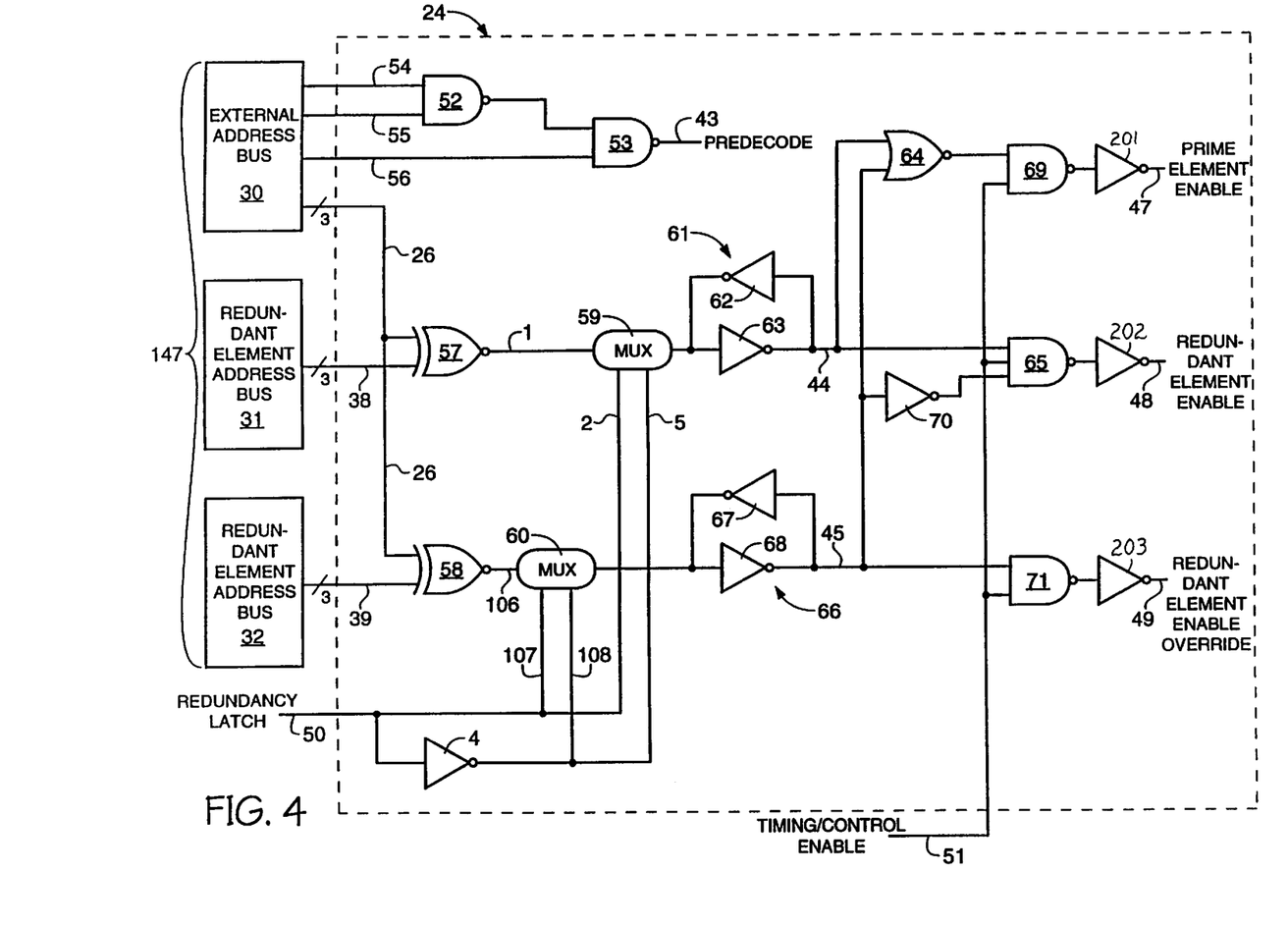
FIG. 4 is a circuit diagram of an embodiment of the enable circuitry of FIG. 3.

Referring now to FIG. 4, there is shown a circuit diagram of an embodiment of enable circuitry 24 in accordance with the present invention. Buses 30, 31, 32 provide an interface 147 to enable circuitry 24. External address bus 30 provides a three-bit address to NAND gates 52 and 53. The three address bits are sent along pathways 54, 55, and 56, respectively, and, in combination with NAND gates 52 and 53, such bits provide PREDECODE signal 43. External address bus 30 also provides each three-bit address to exclusive NOR (XNOR) gates 57 and 58. Redundant element address bus 31 provides a three-bit programmed defective element address to XNOR 57. If there is a match between a three-bit addresses provided by external address bus 30 and a three-bit address provided by redundant element address bus 31, XNOR 57 provides select signal 1 to MUX 59. For purposes of explanation and not limitation, select signal 1 provided from XNOR 57 selects logic 0 from input 2 (redundancy latch signal 50) when a match occurs and selects logic 1 from input 5 (redundancy latch signal 50 inverted by inverter 4) when no match occurs. In other words, for purposes of explanation and not limitation, match signals 44, 45 are active high for a match and inactive low for no match. If select signal 1 is logic high (logic state 1), redundancy latch signal 50 is transferred by MUX 59 to send a logic 0 to inverter 63 of latch 61. Latch 61 (inverters 62, 63) latches a logic 1 (match signal 44) for application to NOR gate 64 and NAND gate 65. Prime element enable (signal) 47 is active (logic high). This is because initially match signals 44, 45 are low (inactive). Which means in an initial address state, latch 61 and 66 provide logic 0, so redundant element enable 48 and redundant element enable override 49 are inactive (logic state 0), and prime element enable 47 is enabled by timing control enable signal 51 being active high. Timing control signal 51 is to control the timing of enabling an element of memory array 15 (shown in FIG. 2). Also, redundancy latch signal 50 provided to MUXs 59, 60 allows for timing control of supplying information of XNORs 57, 58, respectively.

When latch 61 output goes from logic 0 to logic 1, NOR gate 64 provides a logic 0 to NAND gate 69. In which case, prime element enable 47 is inactivated or disabled (logic 0). NAND gate 65, receiving a logic 1 from latch 61 and a logic 1 from inverter 70, will enable redundant element enable 48 when timing/control enable signal 51 is active (logic 1). Therefore, it should be understood that when a match is found between an address and a programmed defective element address, a prime element in memory array 15 (shown in FIG. 2) has been found to be defective and a redundant element has been substituted therefor. Consequently, prime element enable 47 is inactivated to disable access to a defective prime element in memory array 15 (shown in FIG. 2) in favor of enabling access to a redundant element via redundant element enable signal 48. In accordance with the present invention, signal 48 when active has priority over signal 47.

If an employed redundant element is also found to be defective and repaired, a three-bit address provided by redundant element address bus 32 to XNOR 58 may match the address received from external bus 30 to XNOR 58. In such an occurrence, input 107 (logic 0) to MUX 60 is selected by select signal 106 instead of input 108 (logic 1), when redundancy latch signal 50 is active. In other words, signal 106 indicates that a match of address has been detected. Latch 66 receives a logic 0 to inverter 68 (latched by inverters 67, 68) and provides a logic 1 to NOR gate 64, inverter 70 and NAND gate 71. Output of NOR gate 64 is low owing either to latches 61, 66 providing a logic 1. Consequently, prime element enable 47 is inactive. However, as a logic 1 provided from latch 66 to inverter 70 causes NAND gate 65 to receive a logic 0, redundant element enable 48 is inactivated or disabled (logic 0). As NAND gate 71 receives a logic 1 instead of the previously-received logic 0 from latch 66, redundant element enable override 49 is activated with timing control enable signal 51 being active (logic 1). In other words, prime element enable 47 is inactive, redundant element enable 48 is inactive, and redundant element enable override 49 is active. Therefore, when activated, signal 49 has priority over signals 47, 48.

Of course, it should be understood that select signals 1, 106, respectively, select input logic 1 for a no match condition.

In such manner, a separate programmed defective element address may be used to substitute a redundant element, a defective redundant element which was employed to repair a defective prime element. This is accomplished without any test circuitry to determine which programmed banks have previously been employed and without a match test mode. Rather, enable circuitry 24 accomplishes both tasks automatically by prioritizing enable signals 47, 48, 49. Moreover, it should be understood that other circuit implementations may be employed in accordance with the present invention. In particular, MUXs 60 and 59 as well as latches 61 and 66 along with timing control enable 51 and redundancy latch signal 50 may be omitted. Furthermore, it should be understood that an order or a priority exists with respect to programming programmable banks or elements with the same defective addresses. In other words, to use a bank associated with bus 31, the bank must be programmed before a bank associated with bus 32 having the same programmed defective address. However, by providing an address from bus 30 to each XNOR gate 57, 58 along pathway 26, it is not necessary that banks associated with buses 31, 32 be programmed sequentially for different programmed defective addresses.

By way of example and not limitation, assume a bank associated with bus 31 is programmed with 010 and a bank associated with bus 32 is programmed with 100, an address on pathway 26 is 100. In this situation, select signal 1 is low and select signal 106 is high. In response to select signals 1,6, a high input is selected for output of MUX 59 and a low input is selected for output of MUX 60. In response to outputs from MUXs 59, 60, match signal 44 is low and match signal 45 is high. Signal 44 is provided to NOR gate 64 and NAND gate 65. Signal 45 is provided to NOR gate 64, inverter 70, and NAND gate 71. Thus, output of NOR gate 64 is low, which output is provided to NAND gate 69. Output of NAND gate 69 will be high, and so prime element enable signal 47 from inverter 201 is made inactive (low). Output of inverter 70 will be low, so output of NAND gate 65 will be high. Thus, redundant element enable signal 48 from inverter 202 is made inactive (low). Output from NAND gate 71 will be low, so output from inverter 203, namely, redundant element enable override signal 49, is made active (high).

If, for example, an address on pathway 26 was 010, then select signal 1 would be high and select signal 106 would be low. Consequently, a low input would be selected for output of MUX 59, and a high input would be selected for output of MUX 60. In which case, match signal 44 goes high and match signal 45 goes low. This will result in prime element enable signal 47 being made inactive along with redundant element enable signal 49, and redundant element signal 48 will be made active.

Lastly, if, for example, an address on pathway 26 is neither 010 nor 100, then select signals 1, 106 will both go high, and outputs of MUXs 59, 60 will both be high resulting in match signals 44, 45 being low. In which situation, prime element enable signal will be active, and redundant element enable signals will both be inactive.

In any case, enable circuitry 24 automatically identifies which enable signal 47, 48, 49 is to be active.

Notably, no address provided along pathway 26 is ever the same as an unprogrammed address associated with a programmable bank or element. For example, if address 000 is provided along pathway 38 or 39, it may be used to indicate the associated bank of bus 31 or 32, respectively, has not been programmed. In which case, no address along pathway 26 will be 000 to avoid an erroneous match at XNOR 57 or 58. Also, notably prime element enable signal 47 may be used to mask a default prime element enable signal, namely, a maskable interrupt. For example, a default prime element enable signal may be held high and provided to an AND gate along with signal 47. When signal 47 goes inactive low, output of the AND gate will go low, disabling the default enable.

Figure 5:
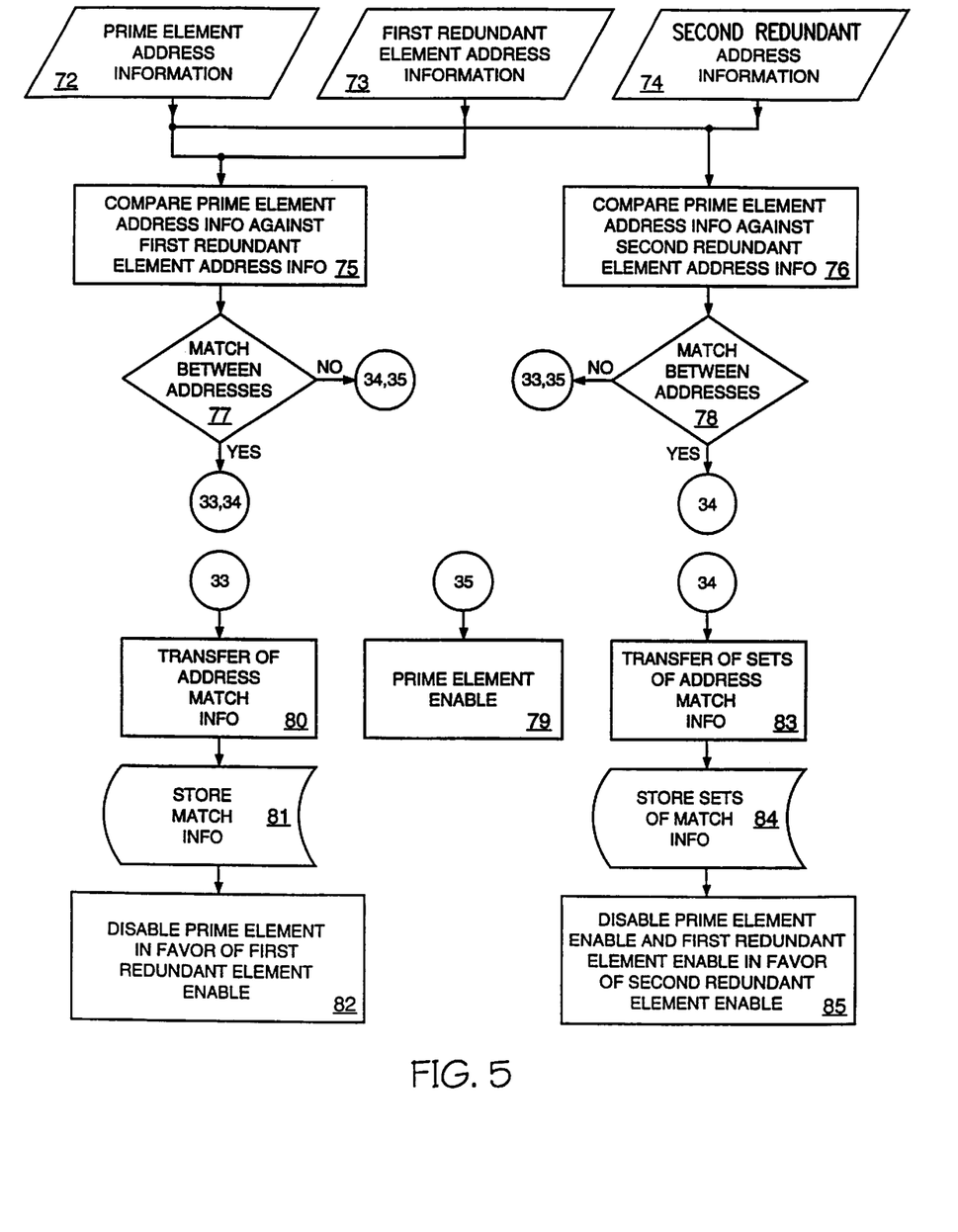
FIG. 5 is a flow chart of an enable process in accordance with the present invention.

Referring now to FIG. 5, there is shown a flow chart of a process in accordance with the present invention. Prime element address information 72, first redundant element address information 73, and second redundant element address information 74 are received. It should be understood that first redundant element address information 73 and second redundant element address information 74 may represent blocks of address information, as explained in more detail elsewhere herein.

At step 75 prime element address information 72 is compared against first redundant element address information 73. At step 77 it is determined whether there is a match between address information 72 and address information 73. If there is no such match, process 35 activates prime element enable at step 79, unless a match is found at step 78 as will be explained. For no match at step 77 or 78, an address provided to memory 10 (shown in FIG. 2) has not been rerouted to a redundant memory element. Therefore, at step 79 prime element enable is activated. If, on the other hand, prime element address information 72 represents a defective prime memory element of memory array 15 (shown in FIG. 2), then at step 77 a match between address information 72 and 73 may occur. In which case, such a match indicates that a prime element to be addressed in memory array 15 (shown in FIG. 2) has been found to be defective and remapped to a redundant element.

By receiving prime element address information 72 and second redundant element address information 74, it may be determined whether a redundant memory element is also defective. At step 76 prime element address information 72 is compared against second redundant element address information 74. At step 78 it is determined whether there is a match between address information 72 and 74. If there is no such match, and at step 77 there was such a match between addresses, then process 33 is employed. At step 80, match information is transferred from step 77. At step 81, such match information is stored. Step 81 is optional. At step 82, prime element enable of step 79 is deactivated in favor of activating first redundant element enable.

If, however, at step 78 a match between addresses did occur, then process 34 is employed. It should be understood that if a prime element is defective, and an associated redundant element has been employed for repair which redundant element is also found to be defective, and a subsequent redundant element has been employed for the defective repair element, all three (prime, associated redundant, and subsequent redundant) elements are keyed off the same prime element address. If at step 78 a match between addresses is true, then at step 77 there must be a match between addresses as well in the case of a repair to a repair. In which case, process 34 is employed. Notably, no match may occur at step 77 and a match may occur at step 78. in which case, process 34 is still employed. Moreover, the present invention is not limited merely to a first, or a first and a second redundant element for repair of a defective prime element but may employ more than two redundant elements.

In process 34, transfer of all sets of address match information found at step 77 and 78 are received at step 83. Optionally, at step 84, all sets of match information may be stored. At step 85, prime element enable is inactivated, if active, and first redundant element enable is disabled (made inactive), if previously enabled (made active), in favor of making active a second redundant element enable.

Figure 6:
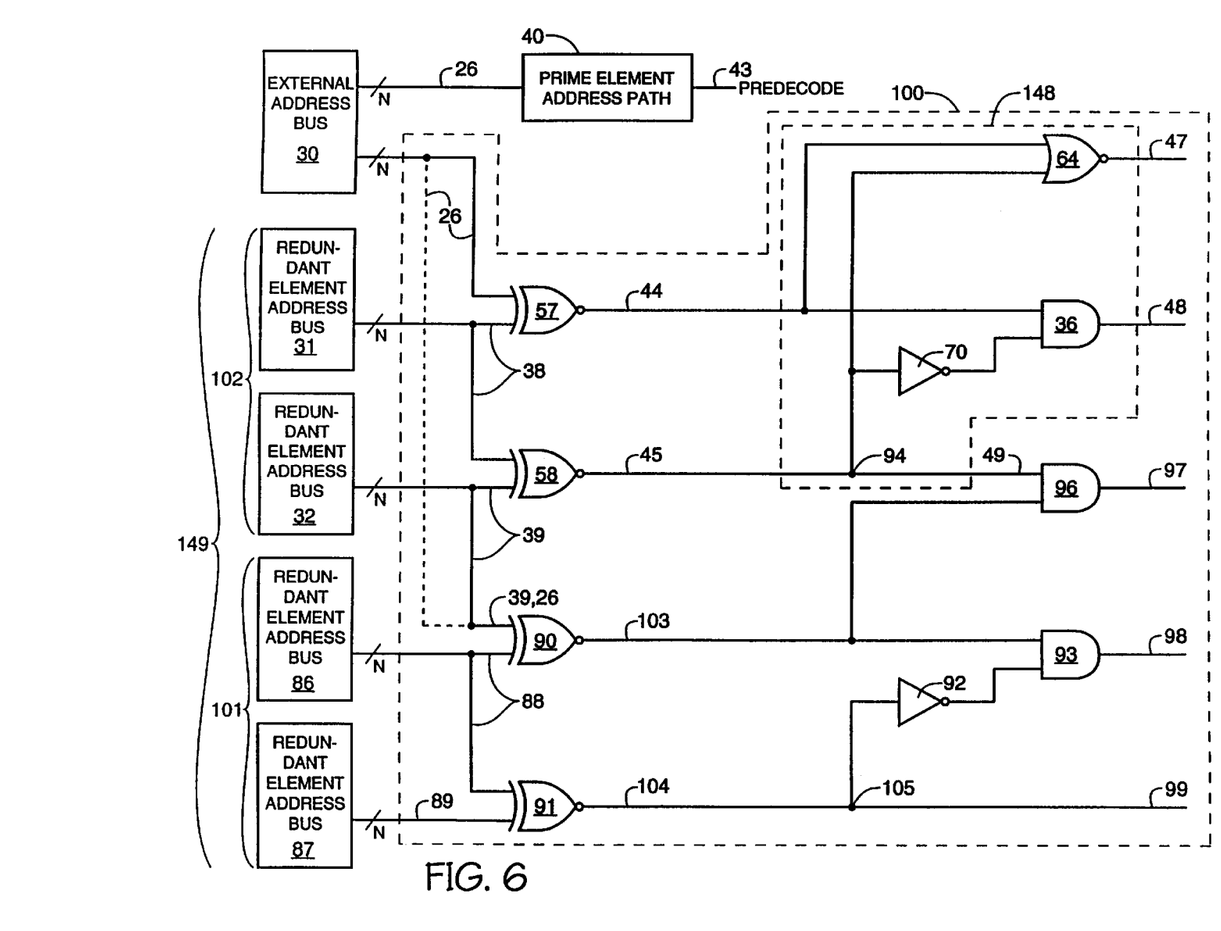
FIG. 6 is a circuit diagram of an embodiment of block enable circuitry in accordance with the present invention.

Referring to FIG. 6, there is shown a circuit diagram of block enable circuitry 100 in accordance with the present invention. Block enable circuitry 100 is similar to enable circuitry 24 shown in FIG. 4, except that the additional optional timing circuitry has been removed and additional redundant element addressing busing has been added. Also, an address from external address bus 30 via pathway 26 is not provided to each XNOR gate 58, 90, 91. Rather, address pathway 26 is provided only to XNOR gate 57 and pathways 38, 39, 88 are provided to XNOR gates 58, 90, 91, namely, pathway 38 to XNOR gates 57, 58, pathway 39 to XNOR gates 58, 90, and path 88 to XNOR gates 90, 91.

It should be understood that in accordance with the present invention, more than one redundant element associated with a redundant element address bus may be employed. Therefore, in accordance with the present invention it is possible to repair a defect, to repair a repair, to repair the repair of a repair, and so on. However, additional redundant element address buses may cause multiple lines to be fed into logic gates, which may make it more difficult to drive logic gates. In other words, more power may be needed to drive one or more logic gates. However, redundant element address buses may be grouped into blocks of buses, where one block has priority over another.

In FIG. 6, shown are two redundant element blocks 102 and 101. Redundant element block 101 has priority over redundant element block 102. For purposes of repair, redundant element block 102 may be completely used prior to using redundant element block 101. In other words, use of a bank associated with redundant element address bus 31 would precede use of a bank associated with redundant element address bus 32, which would precede use of a bank associated with redundant element address bus 86, which would precede use of a bank associated with redundant element address bus 87, where each of the aforementioned banks is programmed with the same prime element defective address. Notably, because redundant element address bus 31 is employed prior to redundant element address bus 32, address signals may be fed directly from redundant element address bus 31 along pathway 38 to XNOR gate 58 for comparison with address signals from redundant element address bus 32. Thus, if programmable elements associated with buses 31 and 32 are programmed with the same address, when that address is provided along pathway 26, it will be the same address as provided along pathways 38, 39. The same holds true for use of address bus 86 and path 88. Thus, to reduce fan out of pathway 26, pathways 38, 39, 88 may be provided to XNOR gates 58, 90, 91, respectively, instead of pathway 26. It should be readily appreciated that more than two blocks 101, 102 may be employed in accordance with the present invention. Moreover, it should be readily apparent that one or more than one redundant element address buses may be employed per block 101, 102. Furthermore, blocks 101, 102 may form a separate block 149.

Override enable circuit 148 receives match signals 44, 45. When match signal 44 is logic high, prime element enable signal 47 is disabled. In which case, prime element enable signal 48 is logic high for match signal 45 low, as signal 45 is inverted by inverter 70 prior to being received by AND gate 36. AND gate 36 receives signal 44, and inverted signal 45 to provide signal 48. Again, the convention of active high is being employed, however, active low may also be employed in accordance with the present invention. If match signal 45 is logic high, then, past node 94, redundant element enable override signal 49 is active. For match signal 45 logic high, prime element enable signal 47 still remains inactive, and redundant element enable signal 48 is made inactive. Redundant element enable override signal 49 is provided to AND gate 36 via inverter 70. While redundant element enable signal 98 is inactive (logic low) and signal 49 is active, redundant element override signal 97 will be high (active) as signal 103 is inactive (logic low) and that signal is inverted by inverter 95 prior to being received by AND gate 96.

Address signals may be provided to XNOR gate 90 via pathway 26. Alternatively, as shown, pathway 39 may be coupled to XNOR gate 90 instead of pathway 26 for reasons stated elsewhere herein. Redundant element address bus 86 provides address signals via address path 88 to XNOR 90 and XNOR 91. If a match occurs between an address signal on pathway 39 and an address signal on path 88, XNOR gate 90 provides an indication of correspondence for signal 103. Redundant element address bus 87 provides address signals to XNOR gate 91 via address path 89. If no match occurs at XNOR gate 91 from an address received via paths 88, 89, signal 104 is inactive (logic low). For signal 104 inactive and signal 103 active, redundant element enable 98 from AND gate 93 goes to active (logic high). Consequently, output of inverter 95 to AND gate 96 is logic low, resulting in redundant element enable override signal 97 being inactive (logic low). If, on the other hand, both signals 103, 104 are active high, indicating matches, redundant element enable override signal 97 is disabled, but match signal 104 provided to inverter 92 causes AND gate 93 output, redundant element enable override signal 98, to go inactive (logic low). Past node 105, if match signal 104 is active, redundant element enable override signal 99 is active.

As shown, by having prioritized blocks 101, 102 of redundant element address buses 31, 32, 86, 87, multiple redundant element addresses may be employed for correction of a defective prime element in memory array 15 (shown in FIG. 2) without having to employ logic gates with a significant number of inputs causing additional power needs. For pathway 26 provided to XNOR 90 instead of pathway 39, if a bank or element associated with bus 31 is employed, but not a bank or element associated with bus 32, then bus 86 or 87 banks or elements may be used without affecting signal 48.

Figure 7:
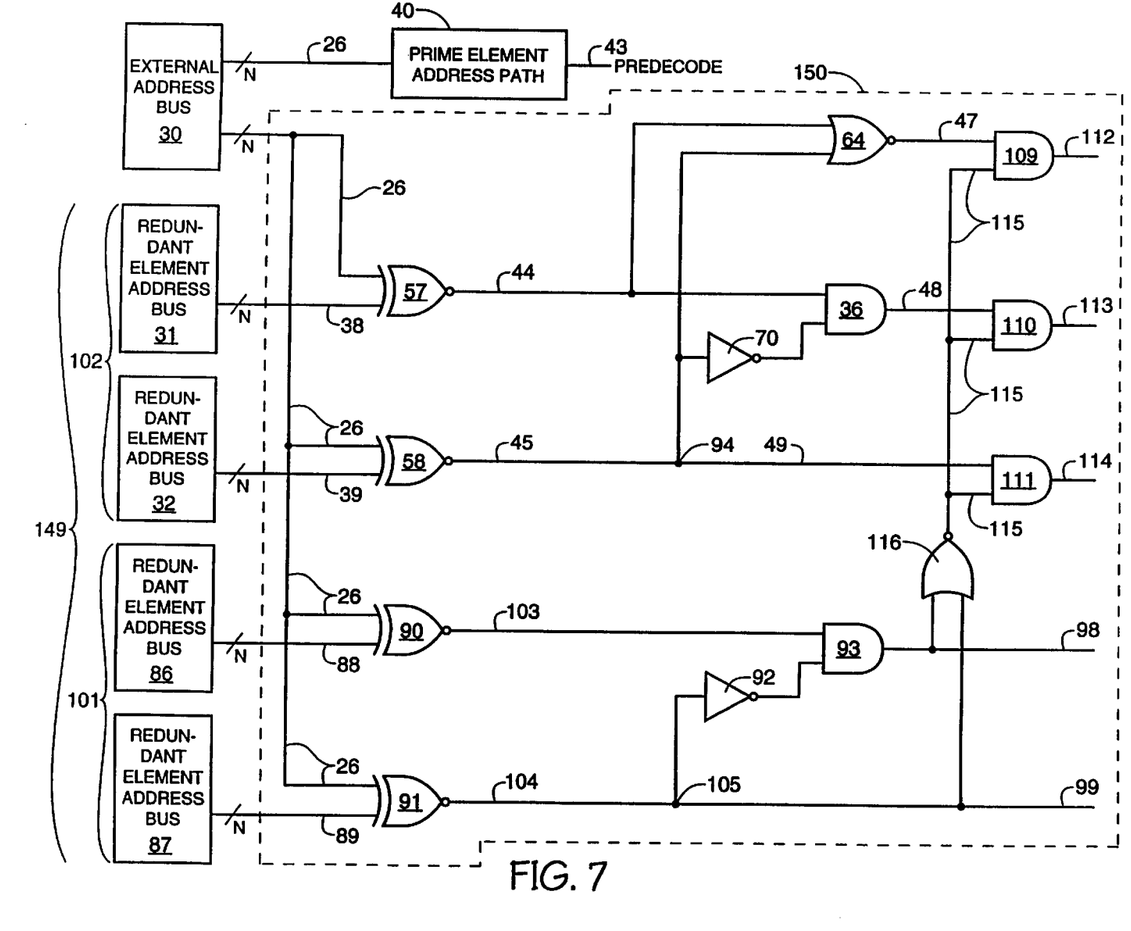
FIG. 7 is a circuit diagram of an alternate embodiment of block enable circuitry in accordance with the present invention.

Referring now to FIG. 7, there is shown a circuit diagram of block enable circuitry 150 in accordance with the present invention. Block enable circuitry 150 is similar to block enable circuitry 100 shown in FIG. 6 with some differences. First, pathway 26 is coupled to each XNOR gate 57, 58, 90, 91, and accordingly, coupling pathways 38, 39, 88 from buses 31, 32, 86 to XNORs 58, 90, 91, respectively, is omitted. Consequently, each new address received along pathway 26 to block enable circuitry 150 may be checked against individual addresses received from buses 31, 32, 86, 87. This alters the priority associated with programmable elements of blocks associated with buses, 31, 32, 86, 87. In other words, each bank or element associated with buses 31, 32, 86, 87 may be used independently. Thus, redundant element address bus 32 may be employed independent of redundant element address bus 31 such that each associated programmable element or bank may have different addresses. Alternatively, such programmable elements or banks associated with block 102 may have a same programmed defective address, in which case an element or bank associated with bus 32 must be programmed later than an element or bank associated with bus 31. However, if either or both banks or elements associated with buses 31 and/or 32 are programmed, they still may be overridden by programming a bank or element associated with bus 86 or 87. This is because block 101 has priority over block 102, as will be explained.

First, for the case when both redundant element enable signals 98 and 99 are inactive (logic low), then output 115 of NOR gate 116 will be high, and each input 115 to AND gates 109, 110, 111 will be high. Consequently, if a signal 47, 48, or 49 is active, its associated enable signal 112, 113, or 114 will also be active. If, on the other hand, either or both signals 98 or 99 are active, then output 115 will be inactive (logic low), and will make each output 112, 113, 114 inactive (logic low).

Figure 8:
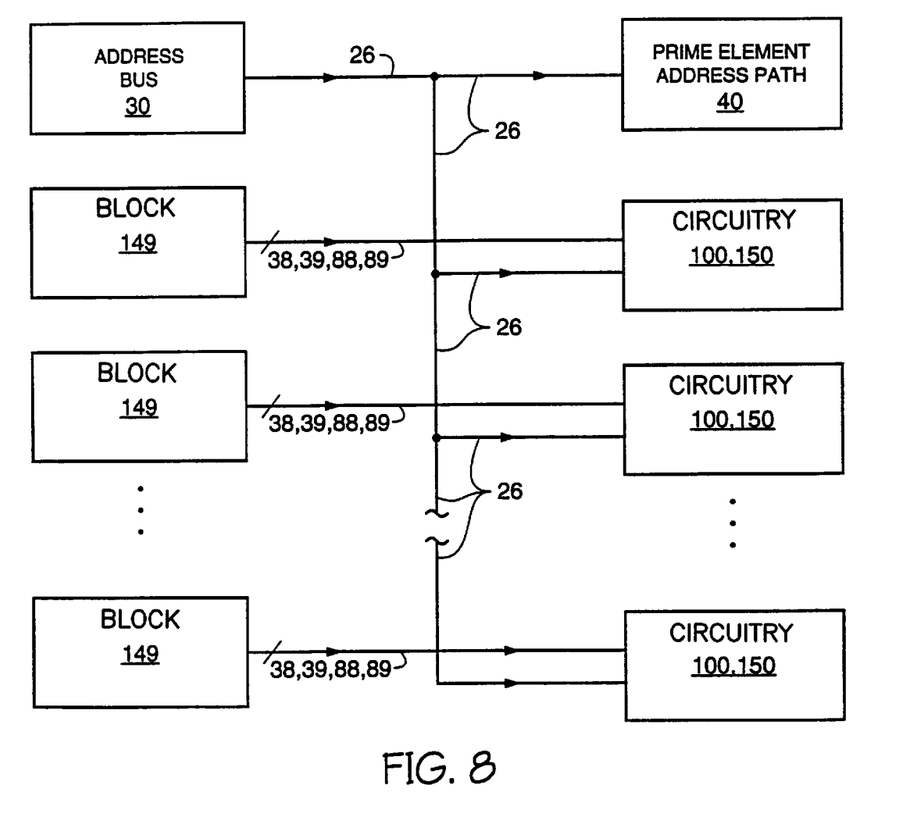
FIG. 8 is a block diagram of an implementation of a plurality of the block enable circuitriescircuitous of FIGS. 6 and 7.

Referring now to FIG. 8, there is shown an implementation of a plurality of enable circuitries 100, 150 in accordance with the present invention. With continuing reference to FIG. 8 and renewed reference to FIGS. 6 and 7, block 149 may include one or more block 101, 102. As previously discussed, blocks 101, 102 may include one or more buses 31, 32, 86, 87. Blocks 149 are coupled to circuitry 100 or 150 by pathways 26, 38, 39, 88, 89. In this manner, multiple redundant elements may be enabled based on a prime element address received from pathway 26 and provided to circuitry 100 or 150.

The present invention has been particularly shown and described with respect to certain preferred embodiments and features thereof, it should be readily apparent to those of ordinary skill in the art that various changes and modifications in form and detail may be made without departing from the spirit and scope of the present invention as set forth in the appended claims. The present invention illustratively disclosed herein may be practiced without any element which is not specifically disclosed herein.

What is claimed is:

1. A memory device for selectively disabling and enabling access to portions of an array of memory elements, the memory circuit comprising:

a first address bus configured to deliver first address information to a first, a second, and a third address path;

a second address bus configured to deliver second address information to the second address path;

a third address bus configured to deliver third address information to the third address path;

the second address path configured to compare the first address information to the second address information and to provide a single first signal in response thereto;

the third address path configured to compare the first address information to the third address information and to provide a single second signal in response thereto; and a circuit configured to selectively disable access to a first redundant memory element and to enable access to a second redundant memory clement in response to the single first signal and the single second signal indicating a relationship between the second and the third address information.

2. A memory circuit for selectively disabling and enabling access to portions of an array of memory elements, the memory circuit comprising:

a first address bus configured to deliver first address information to a first and a second address path;

a second address bus configured to deliver second address information to the second and a third address path;

a third address bus configured to deliver third address information to the third address path;

the second address path configured to compare the first address information to the second address information and to provide a first signal in response thereto;

the third address path configured to compare the second address information to the third address information and to provide a second signal in response thereto; and a circuit configured to selectively disable access to a prime memory element, to selectively enable access to a first redundant memory element in response to the first signal indicating a relationship between the first and the second address information, and to selectively disable access to the first redundant memory element and to enable access to a second redundant memory element in response to the second signal indicating a relationship between the second and the third address information.

3. A memory circuit for enabling access to an array of prime and redundant memory elements, the memory circuit comprising:

a prime element address bus configured to deliver a first address to a prime element address path and to a first redundant element address path;

a first redundant element address bus configured to deliver a second address to the first redundant element address path and to a second redundant element address path;

a second redundant element address bus configured to deliver a third address to the second redundant element address path;

the first redundant element address path configured to compare the first address to the second address and to provide a first match signal in response thereto;

the second redundant element address path configured to compare the second address to the third address and to provide a second match signal in response thereto; and an enable circuit configured to selectively disable access to a prime memory element, to selectively enable access to a first redundant memory element in response to the first match signal indicating equivalence between the first and the second address information, and to selectively disable access to the first redundant memory element and to enable access to a second redundant memory element in response to the second match signal indicating equivalence between the second and the third address information.

4. A memory circuit for enabling access to an array of prime and redundant memory elements, the memory circuit comprising:

a prime element address bus configured to deliver a first address to a prime element address path, and to a first and a second redundant element address path;

a first redundant element address bus configured to deliver a second address to the first redundant element address path;

a second redundant element address bus configured to deliver a third address to the second redundant element address path;

the first redundant element address path configured to compare the first address to the second address and to provide a single first match signal in response thereto;

the second redundant element address path configured to compare the first address to the third address and to provide a single second match signal in response thereto; and an enable circuit configured to selectively disable access to a prime memory element, to selectively enable access to a single first or a single second redundant memory element in response to the single first or the single second match signal, respectively, indicating equivalence between the first and the second address information or the first and the third address information, respectively, and to selectively disable access to the first redundant memory element and to enable access to the second redundant memory element in response to the single first and the single second match signal indicating equivalence between the second and the third address information.

5. A system comprising:

a processor;

input and output devices in electrical communication with the processor; and a memory device in electrical communication with the processor, the memory device comprising:

an array of memory elements including prime and redundant memory elements;

a prime element address bus configured to deliver a first address to a prime element address path, and to a first and a second redundant element address path;

a first redundant element address bus configured to deliver a second address to the first redundant element address path;

a second redundant element address bus configured to deliver a third address to the second redundant element address path;

the first redundant element address path configured to compare the first address to the second address and to provide a first match signal in response thereto;

the second redundant element address path configured to compare the first address to the third address and to provide a second match signal in response thereto; and an enable circuit configured to selectively disable access to a prime memory element, to selectively enable access to a first or a second redundant memory element in response to the first or the second match signal, respectively, indicating equivalence between the first and the second address information or the first and the third address information, respectively, and to selectively disable access to the first redundant memory element and to enable access to the second redundant memory element in response to the first and the second match signal indicating equivalence between the second and the third address information.

6. A system, as in claim 5, wherein the first and the second redundant memory element each comprise a plurality of memory cells.

7. A system, as in claim 6, wherein the first and the second redundant memory element each comprise at least one row or column of said memory cells.

8. A system comprising:

a processor;

input and output devices in electrical communication with the processor; and a memory device in electrical communication with the processor, the memory device comprising:

an array of memory elements including prime and redundant memory elements;

a prime element address bus configured to deliver a first address to a prime element address path and to a first redundant element address path;

a first redundant element address bus configured to deliver a second address to the first redundant element address path and to a second redundant element address path;

a second redundant element address bus configured to deliver a third address to the second redundant element address path;

the first redundant element address path configured to compare the first address to the second address and to provide a first match signal in response thereto;

the second redundant element address path configured to compare the second address to the third address and to provide a second match signal in response thereto; and an enable circuit configured to selectively disable access to a prime memory element, to selectively enable access to a first redundant memory element in response to the first match signal indicating equivalence between the first and the second address information, and to selectively disable access to the first redundant memory element and to enable access to a second redundant memory element in response to the second match signal indicating equivalence between the second and the third address information.

9. A system, as in claim 8, wherein the first and the second redundant memory element each comprise a plurality of memory cells.

10. A system, as in claim 9, wherein the first and the second redundant memory element each comprise at least one row or column of said memory cells.

11. A process for disabling and enabling access to memory elements of a memory array, the process of comprising:

providing a first memory address from a first location;

providing a second memory address from a second location;

providing a third memory address from a third location;

comparing the first memory address to the second memory address to provide a single first output signal indicative of said comparison;

comparing the first memory address to the third memory address to provide a single second output signal indicative of said comparison;

selectively disabling access to a first portion of the memory array and selectively enabling access to a second or a third portion of the memory array in response to the first output signal indicating that a relationship exists between the first and the second memory address; and selectively disabling access to the second portion of the memory array and selectively enabling access to the third portion of the memory array in response to the first and the second output signal indicating that a relationship exists between the second and the third memory address.

12. A process for disabling and enabling access to memory elements of a memory array, the process comprising:

providing a first memory address from a first location;

providing a second memory address from a second location;

providing a third memory address from a third location;

comparing the first memory address to the second memory address to provide a first output signal indicative of said comparison;

comparing the second memory address to the third memory address to provide a second output signal indicative of said comparison;

selectively disabling access to a first portion of the memory array and selectively enabling access to a second portion of the memory array in response to the first output signal indicating that a relationship exists between the first and the second memory address; and selectively disabling access to the second portion of the memory array and selectively enabling access to a third portion of the memory array in response to the second output signal indicating that a relationship exists between the second and the third memory address.

13. A process for disabling and enabling access to memory elements of a memory array, the process comprising:

providing a first memory address from a first location;

providing a second memory address from a second location;

providing a third memory address from a third location;

comparing the first memory address to the second memory address to determine if they are equivalent to one another and providing a first output signal having a state indicative of said comparison of the first memory address to the second memory address;

comparing the first memory address to the third memory address to determine if they are equivalent to one another and providing a second output signal having a state indicative of said comparison of the first memory address to the third memory address;

selectively disabling access to a first portion of the memory array by activating a single signal line and selectively enabling access to a second portion of the memory array in response to the first output signal state indicating equivalence between the first and the second memory address; and selectively disabling access to the second portion of the memory array and selectively enabling access to the third portion of the memory array in response to the first and the second output signal state indicating equivalence between the second and the third memory address.

14. A process for disabling and enabling access to memory elements of a memory array, the process comprising:

providing a first memory address from a first location;

providing a second memory address from a second location;

providing a third memory address from a third location;

comparing the first memory address to the second memory address to determine if they are identical to one another and providing a first output signal having a state indicative of said comparison of the first memory address to the second memory address;

comparing the second memory address to the third memory address to determine if they are identical to one another and providing a second output signal having a state indicative of said comparison of the second memory address to the third memory address;

selectively disabling access to a first portion of the memory array and selectively enabling access to a second portion of the memory array in response to the first output signal state indicating equivalence between the first and the second memory address; and selectively disabling access to the second portion of the memory array and selectively enabling access to a third portion of the memory array in response to the second output signal state indicating equivalence between the second and the third memory address.

* * * * *

UNITED STATES PATENT AND TRADEMARK OFFICE
CERTIFICATE OF CORRECTION

PATENT NO.: 6,055,611

DATED: April 25, 2000

INVENTOR(S) : Jeffrey P. Wright

It is certified that error appears in the above-identified patent and that said Letters Patent is hereby corrected as shown below:

In column 11, line 54, please delete "clement" and insert --element--.

Signed and Sealed this

Seventeenth Day of April, 2001

*Attest:*

NICHOLAS P. GODICI

*Attesting Officer*    *Acting Director of the United States Patent and Trademark Office*